United States Patent [19]

Schröeder

[11] Patent Number: 5,051,540

[45] Date of Patent: Sep. 24, 1991

[54] HOUSING FOR AN ELECTROMECHANICAL COMPONENT

[75] Inventor: Harry Schröeder, Unterhaching, Fed. Rep. of Germany

[73] Assignee: Siemens Aktiengesellschaft, Munich, Fed. Rep. of Germany

[21] Appl. No.: 507,460

[22] Filed: Apr. 11, 1990

[30] Foreign Application Priority Data

Apr. 21, 1989 [DE] Fed. Rep. of Germany ....... 8905080

[51] Int. Cl.[5] .......................... H05K 5/06; H01H 9/30

[52] U.S. Cl. ...................................... 174/52.3; 174/50; 200/306; 335/201

[58] Field of Search .......................... 200/144 R, 306; 174/52.3, 52.1, 50; 335/201, 202, 278

[56] References Cited

U.S. PATENT DOCUMENTS

| | | | |
|---|---|---|---|
| 1,820,375 | 8/1931 | Chandler | 200/302.1 |
| 1,935,465 | 3/1932 | Allendorff et al. | 200/38 |
| 2,870,300 | 1/1959 | Morse | 200/302.1 |
| 3,336,457 | 8/1967 | Julian et al. | 200/306 |
| 4,203,084 | 5/1980 | Yamaguchi et al. | 335/202 |
| 4,309,816 | 1/1982 | Takeyama et al. | 29/622 |

FOREIGN PATENT DOCUMENTS

| | | |
|---|---|---|
| 3039702A1 | 5/1981 | Fed. Rep. of Germany . |
| 8703079.9 | 5/1987 | Fed. Rep. of Germany . |

*Primary Examiner*—Leo P. Picard
*Assistant Examiner*—Bot Lee Ledynh
*Attorney, Agent, or Firm*—Hill, Van Santen, Steadman & Simpson

[57] ABSTRACT

A component housing for an electromechanical component as an aeration opening provided with an insulating shaft formed by an insulating wall extending from the housing wall. The insulating shaft is open to the interior of the housing at an end lying opposite the aeration opening to form an insulating path between voltage carrying parts within the housing and neighboring metallic parts outside of the housing after the aeration opening is opened.

20 Claims, 1 Drawing Sheet

HOUSING FOR AN ELECTROMECHANICAL COMPONENT

BACKGROUND OF THE INVENTION

1. Field of the Invention

The present invention is directed generally to a housing for an electromechanical component having a tightly closed hollow interior and an outwardly open or openable aeration opening, and in particular to a plastic housing for an electromagnetic relay or similar switching equipment.

2. Description of the Related Art

Relays which have plastic housings are usually sealed with an adhesive, a casting resin, or the like so that the sensitive parts within the housing, and in particular the contacts, are protected against the harmful influences of washing solutions, soldering agents and the like.

Under certain circumstances, however, the tightly closed housing can be disadvantageous for the further useful life of the relay or similar component since the plastic housing, the coil and other parts in the relay emit various vapors, gases and the like over the course of time that are harmful to the contacts and that generate a microclimate within the closed housing. Such emissions may be more harmful to the contacts than normal ambient air. It is therefore often standard practice to provide an aeration opening in the housing that can be opened only after the integration of a relay into the housing. Thus, for example, it is known to puncture a prepared, thin walled section of a relay wall, as disclosed in German Published Application 30 39 702, or to cut off a cylindrical or rectangular bleb at a housing corner as disclosed in German Patent Document 87 03 079. However, the possibility of initially covering a passage formed in the housing with a foil and then of pulling the foil off after the relay has been washed and soldered is also possible.

There is the risk with such aeration openings that metal parts arranged inside the housing in the area of the aeration opening do not have adequately long insulating paths from other voltage carrying parts outside of the housing. This can occur, for example, when a relay is integrated on a first printed circuit board and an aeration opening on an upper side of the relay lies in the immediate proximity of an interconnect or a voltage carrying terminal member of a second adjacent printed circuit board. Difficulties particularly derive when mains relays are involved wherein long creep and air paths, for example of at least 8 mm, are required and prescribed for protection against electrical shocks.

SUMMARY OF THE INVENTION

An object of the present invention is to provide a housing for an electromechanical component which has an aeration opening such that, even with integration in the proximity of metallic external parts, the required insulating distances are provided from the outside of the housing to metallic or voltage carrying parts within the interior of the housing and can thus always be guaranteed.

This and other objects and advantages of the invention are achieved in that the aeration opening into the interior of the housing discharges into an insulating shaft that is separated from metallic parts within the interior of the housing by an insulating wall proceeding from the housing wall and that is open toward the interior of the housing at least at an end lying opposite the aeration opening.

The required insulating paths are thus guaranteed by the insulating shielding of the aeration opening in the interior of the housing of the invention regardless of where the component is integrated and regardless of the proximity of metallic or voltage carrying parts. When the aeration opening is provided in a corner region of the housing, then the insulating wall is expediently applied s that it separates a corner region as an insulating shaft together with the side walls of the housing.

In another case, it is also expedient that the insulating wall extends in the form of a tube jacket from the aeration opening in the interior of the housing. The cross section of the tube can be circular, rectangular, or of another arbitrary shape. It is possible to utilize any unused cavities in the interior of the housing as an insulating shaft without increasing the volume of the housing. However, if possible, the aeration opening and the insulating shaft should be applied optimally close to the switching contacts since that is where the aeration is most effective for increasing the useful life of the electromechanical component.

Since the aeration opening is usually provided in a wall at the upper side of a cap composed of insulating material, it is expedient to also directly apply the insulating wall which forms the insulating shaft to the cap.

DESCRIPTION OF THE PREFERRED EMBODIMENTS

Figure 1:
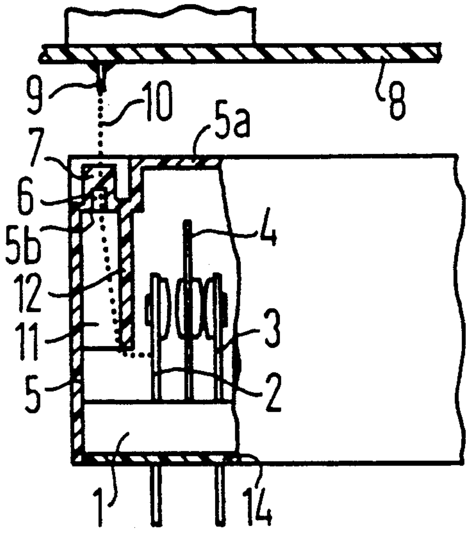
FIG. 1 is an elevational view, partially in cross section, of a relay housing according to the principles of the present invention which has been arranged under a printed circuit board.

FIG. 1 shows a relay housing in partial cross section, whereby a pedestal 1 having two stationary contact elements 2 and 3 as well as a middle contact spring 4 are shown merely schematically within the interior of the housing. The actuation of the contacts occurs in the usual way and thus is not described in 1 detail here.

Together with a cap 5, the pedestal I forms a housing for the relay that is also sealed at its underside with casting compound 14. To create an aeration opening 6, a wall 5*a* at an upper side of the housing is provided with a shoulder 5*b* at a corner on which a severable peg or bleb 7, also referred to as a "nip-off pin", is provided. A channel which forms the aeration opening 6 after the bleb 7 has been severed is provided within the bleb extending from inside the housing.

A printed circuit board 8 is also shown schematically in FIG. 1,. arranged above the relay housing. The printed circuit board 8 includes a voltage carrying terminal pin 9, which accidentally, or otherwise, comes to lie above the aeration opening 6 of the relay housing. In this case, it can thus be assured that the air path, or insulating path 10, shown by a dotted line in FIG. 1 extending between the pin 9 and the contact elements 2 and 3 in the interior of the relay is adequately long to guarantee the required safety against electrical sparking and arc-overs. A sufficiently long air path is guaranteed in that an insulating shaft 11 is formed in the interior of the housing connected to the aeration opening 6. An additional insulating wall 12, which is shown integrally formed with the cap 5, provides the insulating shaft 11.

Figure 2:
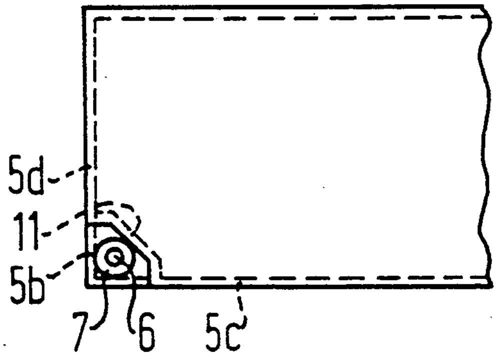
FIG. 2 is a plan view of the housing of FIG. 1 including a separated bleb.

By referring to FIG. 2 it can be seen that the aeration opening 6 lies at a corner of the relay housing. The insulating shaft 11 thus likewise is limited to the housing corner and is formed by the insulating wall 12 together with small sections of the side walls 5*c* and 5*d* of the housing cap 5. Together, these wall sections separate a small volume of air in the housing interior to form the insulating shaft 11. The shape and arrangement of the wall is shown in FIG. 2 cutting generally diagonally across the corner of the housing, with small end sections extending perpendicular to each respective side wall. The aeration opening 6 is initially closed to keep out contaminating agents during the manufacturing and soldering of the relay and is subsequently opened by cutting off the bleb 7 to free the aeration opening 6.

Figure 3:
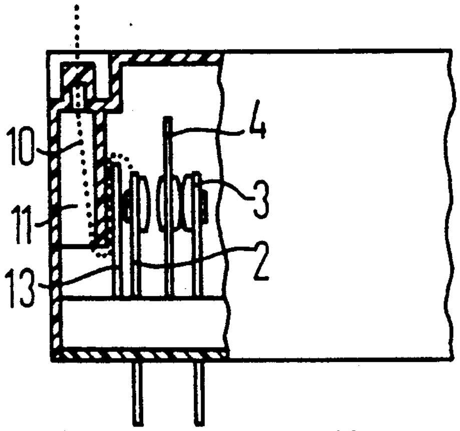
FIG. 3 is an elevational view, partially in cross section, of a modified embodiment of a relay housing over that of the housing shown in FIG. 1.

In FIG. 3 is shown a further development of the invention in which a further partition 13 is applied to the pedestal 1 in addition to the insulating wall 12 molded in the cap 5. The insulating path 10 is thereby further lengthened as shown to form a labyrinth like, or convoluted, air path by of the overlap between the insulating wall 12 and the partition 13.

Figure 4:
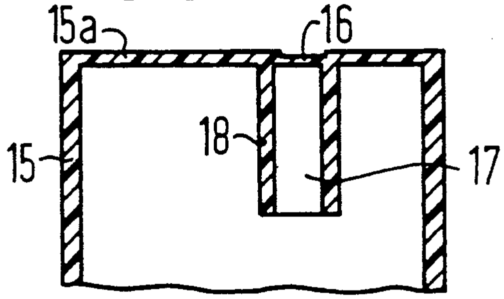
FIG. 4 is a partial cross section of a relay cap including a modified embodiment of the present invention.

A further possible embodiment of the invention is shown in FIG. 4 in which only a housing cap 15 is merely shown, in cross section. The illustrated cap 15 has a weakened or thin section 16 somewhere in the middle region of its upper side which may be penetrated to obtain the desired aeration opening. An insulating shaft 17 in the form of a tube as applied to the cap 15 under and in communication with the weakened section 16. The insulating shaft is formed by an insulating wall or tube jacket 18 in this case. The position of the particular tubular insulating shaft 17 is dependent upon the special relationships and arrangements of the components available within the component housing.

Thus, there is shown and described a component housing for a relay or the like which an aeration opening discharging into an interior of the housing and provided with an insulating shaft separated from any metallic parts in the housing by an insulating wall which extends from the housing wall. The insulating shaft is open to the housing interior at an end opposite the aeration opening. This provides sufficiently long insulating paths between voltage carrying components in the housing interior and neighboring metallic parts outside of the housing.

Although other modifications and changes may be suggested by those skilled in the art, it is the intention of the inventor to embody within the patent warranted hereon all changes and modifications as reasonably and properly come within the scope of his contribution to the art.

I claim as our invention:

1. A housing for enclosing an electromechanical or electromagnetic relay having metal parts, comprising:

a housing wall tightly enclosing a hollow interior, said housing wall having means adapted for forming an outwardly open aeration opening discharging into an insulating path contained within the interior of said housing; and an insulating wall separating said insulating path from the metal parts of the electromechanical or electromagnetic relay, said insulating wall extending from an interior side of said housing wall into said hollow interior and being open to the interior of the housing at least at an end of said insulating path lying opposite said means adapted for forming the aeration opening.

2. A housing as claimed in claim 1, wherein said insulating wall separates a corner region of the hollow interior from the rest of the hollow interior to form said insulating path, said insulating path being defined by said insulating wall and by sections of said housing wall of said housing.

3. A housing as claimed in claim 1, wherein said insulating wall is in the form of a tube extending into the hollow interior of the housing from said means adapted for forming the aeration opening.

4. A housing as claimed in claim 1, further comprising a further insulating partition provided inside said housing, said insulating partition extending in an opposite direction relative to said insulating wall and at least partially overlapping said insulating wall to form a convoluted insulating path.

5. A housing as claimed in claim 1, wherein said housing wall includes a cap of insulating material having an upper wall opposite a floor of said housing, and wherein said means adapted for forming the aeration opening is provided in the upper wall of said cap, said insulating wall being applied to said cap and extending from said upper wall in a downward directional toward said floor of said housing.

6. A housing as claimed in claim 1, wherein said means adapted for forming the aeration opening defines an opening in said housing wall.

7. A housing as claimed in claim 1, wherein said means adapted for forming the aeration opening is initially closed and is selectively openable to form an aeration opening.

8. A housing as claimed in claim 7, wherein said means adapted for forming the aeration opening comprises a severable bleb.

9. A housing as claimed in claim 7, wherein said means adapted for forming the aeration opening comprises a frangible section of said housing wall.

10. A housing for enclosing an electromechanical relay, comprising:

at least one wall enclosing a hollow interior of the housing, said hollow interior being adapted for containing an electromechanical relay having current carrying metal parts;

means for venting said hollow interior to outside of said housing;

an insulating wall within said hollow interior and formed integrally with said at least one wall, said insulating wall blocking a direct path between said means for venting and a nearest one of said current carrying metal parts, said insulating wall at least partially defining an electrical insulating path between said nearest one of said current carrying metal parts and said means for venting.

11. A housing as claimed in claim 10, wherein said means for venting comprises an opening in said at least one wall.

12. A housing as claimed in claim 10, wherein said means for venting comprises a frangible portion of said at least one wall, said frangible portion being selectively openable to form an opening.

13. A housing as claimed in claim 10, wherein said means for venting comprises a hollow peg having a closed end, said hollow peg being severable to form an opening into said hollow interior.

14. A housing as claimed in claim 10, wherein said insulating wall is a first insulating wall, and further comprising:

a second insulating wall within said hollow interior overlapping said first insulating wall to form a convoluted insulating path between said means for venting and said nearest one of said current carrying metal parts.

15. A housing as claimed in claim 10, wherein said at least one wall comprises at least two walls meeting to form a corner, wherein said means for venting is adjacent said corner, and wherein said insulating wall extends between said at least two walls adjacent said corner to form an insulating path at said corner.

16. A housing as claimed in claim 10, wherein said insulating wall comprises a tube having a first end in communication with said means for venting and a second end extending into said hollow interior, said tube defining an air path of sufficient length to prevent arcing through said tube.

17. A housing as claimed in claim 16, wherein said tube is at least 8 mm in length.

18. A housing as claimed in claim 10, wherein said insulating wall defines an electrical insulating path of at least 8 mm in length from said nearest one of said current carrying metal parts to said means for venting.

19. A housing for a miniature electromechanical relay having metal parts, comprising:

a plurality of walls enclosing an interior space that is adapted to receive an electromechanical relay;

means for venting said interior space to outside said housing;

an insulating wall extending from at least one of said plurality of walls and molded in one piece with said at least one wall, said insulating wall blocking a direct path between said means for venting and a nearest one of the metal parts of said electromechanical relay, said insulating wall extending in an otherwise unoccupied portion of said interior space without increasing external dimensions of said housing, said insulating wall defining an insulating path between a nearest one of the metal parts and said means for venting sufficient to prevent arcing through said means for venting.

20. A housing as claimed in claim 19, wherein said means for venting is an initially closed location on one of said plurality of walls, said initially closed location being selectively openable.

* * * * *